United States Patent [19]

Carpentier et al.

[11] Patent Number: 4,801,990
[45] Date of Patent: Jan. 31, 1989

[54] HGCDTE AVALANCHE PHOTODIODE

[75] Inventors: Yves Carpentier, Savigny sur Orge; Michel Royer, Paris, both of France

[73] Assignee: Societe Anonyme de Telecommunications, Paris, France

[21] Appl. No.: 44,760

[22] Filed: May 1, 1987

[30] Foreign Application Priority Data

May 7, 1986 [FR] France ................. 86 06614

[51] Int. Cl.[4] ............................................ H01L 27/14
[52] U.S. Cl. ....................................... 357/30; 357/52; 357/13; 357/63; 357/61; 357/58
[58] Field of Search ..................... 357/13, 30 A, 30 B, 357/30 F, 30 D, 30 M, 30 P, 30, 52, 52 D, 63, 61, 58

[56] References Cited

U.S. PATENT DOCUMENTS 4,137,544  1/1979  Koehler ............................. 357/30
4,208,003  6/1980  Koehler ....................... 357/30 B X

FOREIGN PATENT DOCUMENTS 0045258  2/1982  European Pat. Off. .
0045558  3/1982  European Pat. Off. .
0060743  9/1982  European Pat. Off. .
2138209  10/1984  United Kingdom .

OTHER PUBLICATIONS

Alabedra et al., "An $Hg_{0.3}Cd_{0.7}Te$ Avalanche Photodiode for Optical-Fiber Transmission Systems at $\lambda=1.3$ μm," *IEEE Trans. on Elect. Devices*, ED-32, (1985), Jul., No. 7, pp. 1302-1306.

Tredwell, "(Hg,Cd)Te Photodiodes for Detection of Two-Micrometer Infrared Radiation," *Optical Engineering*, May-Jun. 1977, vol. 16, No. 3, pp. 237-240.

Shin et al., "High Performance Epitaxial HgCdTe Photodiodes for 2.7 μm Applications,".*IEEE Electron Device Letters*, vol. EDL-2, No. 7, Jul. 1981, pp. 177-179.

Marine et al., "Infrared Photovoltaic Detectors from Ion-Implanted $Cd_xHg_{1-x}Te$," *Appl. Phys. Lett.*, vol. 23, No. 8, Oct. 15, 1973, pp. 450-452.

Primary Examiner—Andrew J. James
Assistant Examiner—William A. Mintel
Attorney, Agent, or Firm—Stevens, Davis, Miller & Mosher

[57] ABSTRACT

An HgCdTe avalanche photodiode for use at ambient temperature comprises an $Hg_{1-x}Cd_xTe$ crystal substrate in which x is chosen between substantially 0.35 and substantially 0.5, a PN junction is formed in the substrate with low concentrations in the vicinity of the junction, by impurity penetration from a polished and chemically etched surface and the P zone is illuminated. A guard band is provided around the PN junction. The dark current of the photodiode is less than 0.1 Å/cm2 at ambient temperature and the excess noise factor is less than 0.4. The photodiode of the invention is used for detecting signals transmitted along fluorated glass optical fibers, for example.

10 Claims, 2 Drawing Sheets

HGCDTE AVALANCHE PHOTODIODE

BACKGROUND OF THE INVENTION

1. Field of the Invention

The present invention relates to a photodiode provided for use under avalanche operating conditions at ambient temperature, and including a PN junction surrounded by a guard ring and made from an $Hg_{1-x}Cd_xTe$ crystal.

Such a photodiode may be used, for example, for receiving optical signals propagating along optical fibers. In fact, the avalanche operating conditions provide a step-up of the photocurrent, by avalanche, which confers a good sensitivity on the photodiode. Furthermore, operating at ambient temperature makes possible a use which would be too heavy with a photodiode which has to be cooled.

2. Description of the Prior Art

Photodiodes of this type are already known from the French Pat. No. 81 04712, whose maximum sensitivity corresponds to a wave length between 0.8 μm and 2 μm.

These known photodiodes are therefore not adapted to use with optical fibers made from fluorated glass which, in the spectral band situated between 2 and 4 μm, will theoretically have extremely low losses of the order of $10^{-3}$ dB/km, and which should allow links of several hundreds of kilometers in length to be constructed without receivers.

In order to obtain an $Hg_{1-x}Cd_xTe$ photodiode which is sensitive in a certain spectral band, it is known to adjust the molar fraction x of the material which is used. In fact, the molar fraction x controls the width of the forbidden band or "gap" of the material and so its spectral response.

Thus, from the patent U.S. Pat. No. 4,137,544 a $Hg_{1-x}Cd_xTe$ photodiode is known whose molar fraction x is chosen equal to 0.2, so that the spectral response of the photodiode corresponds to the 8–14 μm range. For this value of the molar fraction x, the width of the forbidden band is very small and does not allow operation at ambient temperature. Such a photodiode therefore requires a cooling device. As is known, the same goes for all the $Hg_{1-x}Cd_xTe$ photodiodes whose molar fraction is less than substantially 0.35. Moreover, this diode is not adapted for operating under avalanche conditions, particularly because it has no guard ring about the PN junction.

An $Hg_{1-x}Cd_xTe$ photodiode, whose molar fraction x is chosen equal to 0.4 so that the spectral response is centered on 2.7 μm, is described by S. H. SHIN et al in "High Performance Epitaxial Hg Cd Te Photodiode for 2.7 μm Applications", IEEE Electron Devices Letters, vol. EDL-2, no. 7, July 1981, pages 177–179, New York USA. This photodiode operates at ambient temperature, but it is not adapted for operating under avalanche conditions, particularly because it has no guard ring.

The modification of the two preceding photodiodes so as to be able to cause them to operate under avalanche conditions is a priori unthinkable, considering the fact that the biasing in the avalanche region of a junction of small forbidden band width, leads to the creation of a dark current due to the tunnel effect which is too high to allow satisfactory operation of the photodiode. This problem is in particular mentioned by HIROAKI ANDO et al in the article "INGaAS/InP Separated Absorption and Multiplication Regions Avalanche Photodiode using Liquid and Vapor Phase Epitaxies" pages 250–254 IEEE Journal of Quantum Electronics vol. QE-17, no. 2, February 1981.

In order to overcome the above problems, the prior art teaches abandoning conventional photodiodes for photodiodes having separated absorption and multiplication regions. In these photodiodes, the photons are absorbed in a material having a small forbidden band width. The electron-hole pairs thus created diffuse as far as the junction situated in a material of wider forbidden band width. The junction is biased in the avalanche region so as to multiply the photocurrent created in the region of small forbidden band width. Such a photodiode is however complex in design and manufacture.

SUMMARY OF THE PRESENT INVENTION

The present invention aims at overcoming the above drawbacks by providing an avalanche photodiode, with a single PN junction, for use at ambient temperature in the 2–4 μm range. It associates in a single device, the detection function and the preamplification function.

For this, it provides a photodiode of the above defined type, in which:

the molar fraction x is between substantially 0.35 and substantially 0.5, the N zone has an N carrier concentration less than or equal to $2.10^{15}/cm3$, the P zone has a P carrier concentration less than or equal to $10^{16}/cm3$ and receives the radiation to be detected, and the PN junction is obtained by penetration of impurities from a polished and chemically etched surface.

In the photodiode of the invention, the applicant provides a guard ring which, as is known, permits operation under avalanche conditions. However, he chooses the molar fraction x as a function of the spectral response, that is to say here so as to correspond to a small forbidden band width, thus going against the prejudices of the prior art concerning the avalanche operating conditions in this case. Through weak doping in the vicinity of the junction and a surface treatment, it proves that the parasite current, and in particular the current related to the tunnel effect, are fairly small so as to allow good operation. In addition, illumination of the P zone provides a low excess noise factor because, for the values of the molar fraction x considered, the coefficient of ionization of the electrons α is much greater than the coefficient of ionization of the holes β. Thus, the multiplication factor of the photocurrent may be relatively high and the overall performances satisfactory.

Advantageously:

the N zone has an N carrier concentration greater than or equal to $5.10^{14}/cm3$, the P zone has a P carrier concentration greater than or equal to $10^{15}/cm3$.

Again advantageously, said surface from which the impurities are caused to penetrate is subjected to the following chemical etching and polishing treatments:

polishing with alumina of a grain size of 0.02 μm for one hour, mecano-chemical polishing with alumina having a grain size of 0.02 μm in a solution of 25 g/l of $CrO_3$ for an hour, and chemical etching with hydrochloric acid.

In a first embodiment, the $Hg_{1-x}Cd_xTe$ crystal is a solid crystal obtained by the THM (travelling heater method) process.

In a second embodiment, the $Hg_{1-x}Cd_xTe$ crystal is a crystal obtained by epitaxy from a semiconductor substrate.

BRIEF DESCRIPTION OF THE DRAWINGS

The present invention will be better understood from reading the following description of two embodiments of the photodiode of the invention, with reference to the accompanying drawings in which.

DESCRIPTION OF THE PREFERRED EMBODIMENTS

The avalanche photodiode of the invention is made from a crystal of a mercury, cadmium and telluride alloy $Hg_{1-x}Cd_xTe$, in which the molar fraction x is, within the range 0.35-0.5, adjusted to a value corresponding to the maximum desired sensitivity of the photodiode, in the 2-4 μm range, as was mentioned in the French Pat. No. 81 04 712 in the name of the applicant. In a first embodiment, for producing the photodiode, a solid substrate 1, shown in FIG. 1, is provided.

To obtain this substrate 1, an ingot of $Hg_{1-x}Cd_xTe$ is produced by the so called travelling heater method described in the French Pat. No. 81 05 387 in the name of the applicant. Thus an ingot is obtained having a P type electronic character which is cut into disks of a thickness of 500 μm. Each disk is subjected to a temperature of 300° C. under a saturating mercury vapor pressure for a period of 2 months, so as to convert it into an N type material. Thus a substrate 1 is obtained of type N in which the N carrier concentration is low, and typically between $5.10^{14}$ and $2.10^{15}/cm3$ at ambient temperature.

Figure 1:
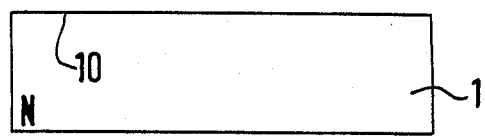
FIGS. 1 to 4 illustrate the different phases of a first method of manufacturing the photodiode of the invention.

The upper face 10, in FIG. 1, of substrate 1 from which the PN junction will then be prepared by diffusion, undergoes first of all prepolishing with alumina of a grain size of 0.3 μm for an hour, then the following polishing and chemical etching treatments:

polishing with alumina of a grain size of 0.02 μm for one hour, mecano-chemical polishing with alumina having a grain size of 0.02 μm in a solution of 25 g/l of $CrO_3$ for an hour, and chemical etching with hydrochloric acid.

After these treatments, the surface of face 10 of the substrate 1 has no longer any apparent defects when observed with an electronic scan microscope, in the induced current mode.

On face 10 a double masking layer is deposited, here by cathodic sputtering. A layer 2 of CdTe is deposited first of all, then on layer 2 a layer 3 of ZnS, or $SiO_2$ is deposited. These layers are deposited at a rate of 250 Å/min for CdTe and 100 Å/min for ZnS or $SiO_2$.

Figure 2:
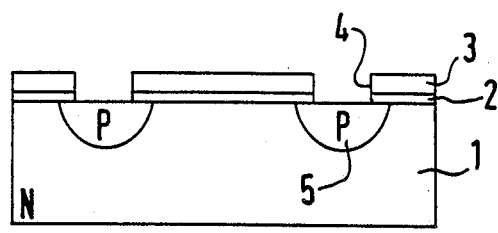

As shown in FIG. 2, a diffusion window 4 is then opened in the masking layers 2 and 3 for the formation of a guard ring 5. Window 4 is formed by chemical etching. Thus, the ZnS is etched by means of the concentrated hydrochloric acid, the $SiO_2$ by hydrofluoric acid and the CdTe by a 0.1% solution of bromine and methanol.

The guard ring 5, of type P, is then formed by diffusion of gold under a saturating mercury vapor pressure at 300° C., for a period of 8 hours, so as to obtain a P carrier concentration between $10^{15}$ and $10^{16}/cm3$. The guard ring 5 could also be formed by diffusion of phosphor or arsenic.

Figure 3:
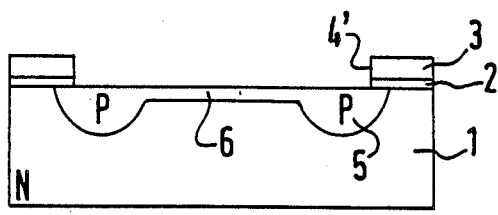

As shown in FIG. 3, the parts of layers 2 and 3 inside window 4 are then removed by chemical etching so as to form a window 4' for diffusing a P type zone 6, that is to say here the sensitive surface of the photodiode.

This zone 6 is formed by diffusion of gold under a saturating mercury vapor pressure at 300° C., for a period of 2 hours, so as to obtain a P carrier concentration between $10^{15}$ and $10^{16}/cm3$, over a thickness less than that of the guard ring 5. Hereagain, instead of gold, phosphor or arsenic could be diffused.

Figure 4:
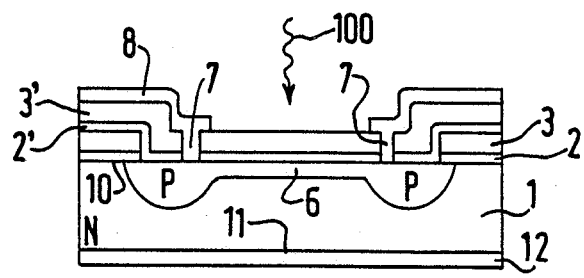

As shown in FIG. 4, a double passivation layer is then deposited. A layer 2' of CdTe is deposited under the same conditions as layer 2. A layer 3' of ZnS or of $SiO_2$ is deposited under the same conditions as layer 3.

Then, openings are formed in the layers 2' and 3' by chemical etching, and these openings are metallized by depositing, for example by cathodic sputtering platinum then gold so as to form contact 7. The platinum is deposited at a rate of 100 Å/min and the gold at a rate of 250 Å/min. The whole of the upper surface is then coated with a metal layer of platinum and gold, then the major part is removed so as to only leave metallizations 8 necessary for forming connections, during an etching operation. The etching operation is achieved by coating first of all the zones intended to become the metallizations 8 with a protective resin, using a known process. Then, the unprotected metal layer is removed by inverse sputtering under an argon plasma, that is to say that the metal layer is bombarded with argon ions so that, under the action of this bombardment, the metal is pulverised and is separated from the surface of the photodiode. The rate at which the metal layer decreases in thickness is 50 Å/min. This low rate allows etching to be carried out without any risk of damaging the photodiode produced.

Substrate 1 is then made thinner by grinding its lower face 11, in FIG. 4, with alumina of a grain size of 0.3 μm. Face 11 is then metallized by cathodic sputtering with a platinum and gold layer 12, under the same conditions as above.

The photodiode thus obtained is mounted in a case not shown, formed so that the photons at 100 to be detected illuminate the P zone, as is shown in FIG. 4.

Figure 5:
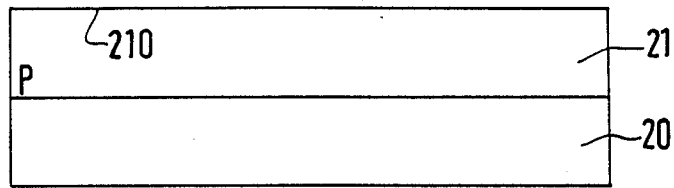
FIGS. 5 to 8 illustrate the different phases of a second method of manufacturing the photodiode of the invention.

In a second embodiment, for producing the photodiode, an $Hg_{1-x}Cd_xTe$ crystal 21 is first of all provided, with reference to FIG. 5, which is obtained by epitaxial growth from a semiconductor substrate 20, here and for example made from 111 oriented monocrystalline CdTe.

To cause the $Hg_{1-x}Cd_xTe$ crystal 21 to grow, one of the known epitaxy growth techniques is used, for example:

LPE (liquid phase epitaxy) growth

MBE (molecular beam epitaxy) growth

MOCVD (metallo-organic-chemical vapor deposition) growth.

Thus an $Hg_{1-x}Cd_xTe$ crystal 21 is grown having a thickness typically equal to 20 μm and a P carrier concentration typically between $10^{15}$ and $10^{16}/cm3$. The upper face 210, FIG. 5, of crystal 21 is then subjected to the following polishing and chemical etching treatments:

polishing with alumina of a grain size of 0.02 μm for one hour, mecano-chemical polishing with alumina having a grain size of 0.02 μm in a solution of 25 g/l of $CrO_3$ for one hour, and chemical etching with hydrochloric acid.

After these surface treatments, masking layers 22 and 23 are deposited having compositions identical to those of layers 2 and 3, and under identical conditions.

Figure 6:
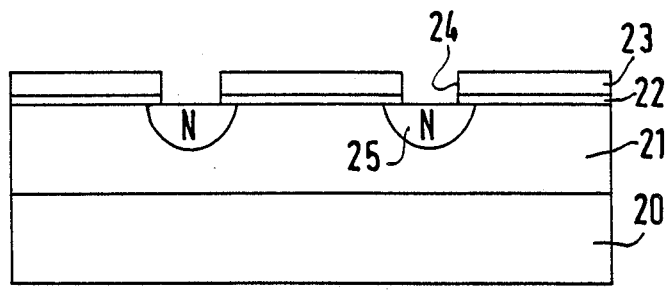

As shown in FIG. 6, a window 24 is then opened in the masking layers 22 and 23 so as to form a guard ring 25, window 24 is formed by chemical etching.

The guard ring 25, of N type, is then formed by diffusion of mercury under a saturating mercury vapor pressure at 300° C. for a period of 8 hours, so as to obtain an N carrier concentration between $5.10^{14}$ and $2.10^5$ (cm3 at ambient temperature).

Figure 7:
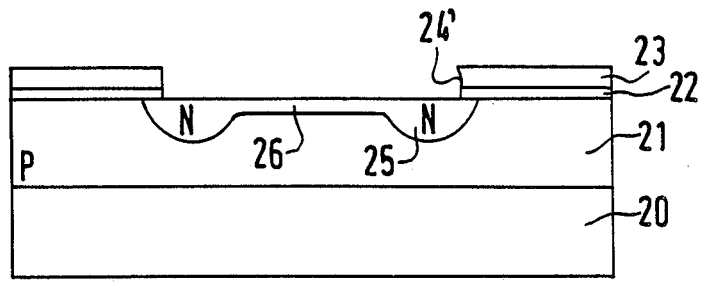

As shown in FIG. 7, the parts of layers 22 and 23 inside the window 24 may then be removed by chemical etching so as to form a window 24' for diffusing an N type zone 26, that is to say here the sensitive surface of the photodiode. This zone 26 is formed by implanting $Al^{2+}$ ions under 60 KeV at the rate of $10^{14}$ ions per cm2, followed by annealing under saturating mercury vapor pressure at 300° C., for a period of 2 hours. Thus an N carrier concentration is obtained between $5.10^{14}$ and $2.10^{15}$/cm3 at ambient temperature.

Figure 8:
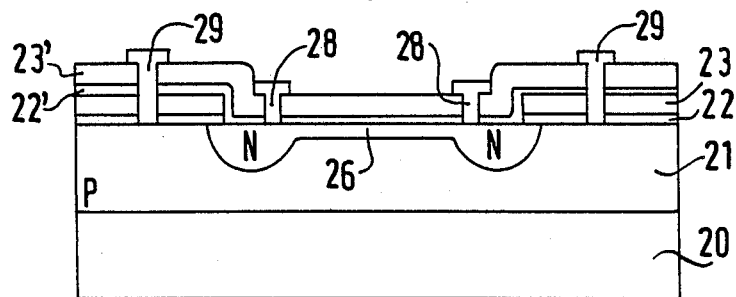

As shown in FIG. 8, passivation layers 22' and 23' are then deposited, having compositions identical to those of layers 2' and 3' and under the same conditions.

Then contacts 28 are formed for access to zone N and contacts 29 for access to zone P by proceeding as for the formation of contact 7. Similarly, metallizations are formed which are not shown in FIG. 8 for the sake of simplicity.

The photodiode thus obtained is mounted in a case adapted so that the photons 100 to be detected illuminate the P zone. For this, the thickness, of the order of 20 μm, of the epitaxy zone 21 has been chosen so as to allow complete absorption of the photons in the vicinity of the junction.

The photodiodes thus obtained have a small dark current less than 0.1 A/cm2, for the quality of the $Hg_{1-x}Cd_xTe$ crystal, the strict control of the surface conditions and the low doping used mean that the concentrations in the vicinity of the junction are small, which results in reducing the dark current related to the tunnel effect.

Moreover, the excess noise factor x (not to be confused with the molar fraction x) related to the avalanche multiplication is small. This is due to the fact that, for the range of molar fractions considered, the ratio between the coefficient of ionization of holes $\beta$ and the coefficient of ionization of electrons $\alpha$ is very much less than 1 and to the fact that the photodiode is illuminated from the P side.

In the article "$Ga_{1-x}Al_xSb$ Avalanche Photodiodes: Resonant Impact Ionization with very high ratio of Ionization Coefficients" by HILDEBRAND et al, in the review "IEEE Journal of Quantum Electronics", vol. QE-17, no. 2, February 1981, a method is described for reducing the excess noise factor in which a wave length is chosen under operating conditions for which $\beta$ is very much less than $\alpha$, the diode being illuminated by the N zone. The applicant, having discovered that in an $Hg_{1-x}Cd_xTe$ crystal of a composition corresponding to a wave length with cut off greater than 2 μm, the ratio $\beta/\alpha$ was very much less than 1, chose to illuminate the P zone so as to benefit both from a high multiplication factor and from a low excess noise factor.

By way of example, the characteristics of an avalanche photodiode constructed in accordance with the first embodiment are the following:

| | |
|---|---|
| Molar fraction | 0.5 |
| Cut off wave length | 2.5 μm |
| Sensitive surface | $5.10^{-5}$ cm2 |
| Avalanche voltage | −28 V |
| Multiplication factor (V = −28 V) | 10 |
| Saturation current (V = −1 V) | 50 nA to 25° C. |
| | 1 nA to −20° C. |
| Dark current (V = −10 V) | 200 nA |
| Excess noise factor (V = −28 V) | 0.4 |
| Total capacity (V = −10 V) | 1 pF |
| Current response | 1.2 A/W |
| (λ = 2.2 μm and V = −1 V) | |

The particularly low dark current will be noted as also the fact that the current response, for V = −1 V, is comparable to that obtained in prior art photodiodes which cannot operate under avalanche conditions. Thus, considering the multiplicative factor of 10 obtained under avalanche conditions, for the photodiode of the invention everything takes place as if this latter were 10 times more sensitive. It will also be noted that this result was obtained without too high a noise increase, since the excess noise factor remains small.

What is claimed is:

1. A photodiode for use under avalanche operating conditions at ambient temperature comprising:

a substrate formed of a $Hg_{1-x}Cd_xTe$ crystal, wherein a molar fraction x is between substantially 0.35 and substantially 0.5;

an N conductivity zone formed in said substrate and having an N carrier concentration less than or equal to $2.10^{15}$/cm3;

a P conductivity zone formed in said substrate and having a P carrier concentration less than or equal to $10^{16}$/cm3, said P conductivity zone receiving radiation to be detected;

a PN junction formed at a boundary of said P and N conductivity zones, said PN junction being formed by penetration of impurities from a polished and chemically etched surface of said substrate;

a guard band provided in said substrate and surrounding said PN junction and said photodiode exhibiting an avalanche phenomenon.

2. The photodiode as claimed in claim 1, wherein:

the N zone has an N carrier concentration greater than or equal to $5.10^{14}$/cm3, the P zone has a P carrier concentration greater than or equal to $10^{15}$/cm3.

3. The photodiode as claimed in claim 1, wherein said surface is subjected to the following polishing and chemical etching treatments:

polishing with alumina of a grain size of 0.02 μm for one hour, mecano-chemical polishing with alumina having a grain size of 0.02 μm in a solution of 25 g/l of $CrO_3$ for an hour, and chemical etching with hydrochloric acid.

4. The photodiode as claimed in claim 1, including a stacked pair of masking and passivation layers on said substrate surface, each pair including a first layer of CdTe and a second layer of one of the materials ZnS and SiO$_2$.

5. The photodiode as claimed in claim 1, wherein the Hg$_{1-x}$Cd$_x$Te crystal is a solid crystal obtained by the Travelling Heater Method (THM).

6. The photodiode as claimed in claim 5, wherein said surface is subjected, before polishing and chemical etching, to prepolishing with alumina of a grain size of 0.3 μm for an hour.

7. The photodiode as claimed in claim 5, wherein the N zone is obtained by subjecting the crystal to a temperature of 300° C. under a saturating mercury vapor pressure.

8. The photodiode as claimed in claim 5, wherein the P zone is obtained by diffusion of gold under a saturating mercury vapor pressure at 300° C.

9. The photodiode as claimed in claim 1, wherein the Hg$_{1-x}$Cd$_x$Te crystal is a crystal obtained by epitaxy from a semiconductor substrate.

10. The photodiode as claimed in claim 9, wherein the N zone is obtained by ionic implantation of Al$^{2+}$ ions.